United States Patent
Arora et al.

(10) Patent No.: US 10,187,071 B2
(45) Date of Patent: Jan. 22, 2019

(54) PLL LOCK RANGE EXTENSION OVER TEMPERATURE

(71) Applicant: TEXAS INSTRUMENTS INCORPORATED, Dallas, TX (US)

(72) Inventors: Himanshu Arora, Plano, TX (US); Siraj Akhtar, Richardson, TX (US); Lu Sun, Shanghai (CN); Hamid Safiri, Plano, TX (US); Wenjing Lu, Shanghai (CN); Nikolaus Klemmer, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/387,636

(22) Filed: Dec. 21, 2016

(65) Prior Publication Data
US 2017/0264302 A1 Sep. 14, 2017

Related U.S. Application Data

(60) Provisional application No. 62/270,505, filed on Dec. 21, 2015.

(51) Int. Cl.
*H03L 7/099* (2006.01)
*H03L 7/10* (2006.01)
*H03L 1/02* (2006.01)

(52) U.S. Cl.
CPC ............ *H03L 7/103* (2013.01); *H03L 1/021* (2013.01); *H03L 1/026* (2013.01); *H03L 7/099* (2013.01); *H03L 7/10* (2013.01); *H03L 2207/06* (2013.01)

(58) Field of Classification Search
CPC ......... H03L 1/023; H03L 1/025; H03L 7/099; H03L 7/10; H03L 7/102–7/104
See application file for complete search history.

(56) References Cited

U.S. PATENT DOCUMENTS

| | | | | |
|---|---|---|---|---|
| 8,022,780 B2* | 9/2011 | Taghivand | ............. | H03L 1/025 331/176 |
| 8,217,690 B2* | 7/2012 | Hu | ........................ | H03L 1/022 327/105 |
| 8,253,506 B2* | 8/2012 | Liu | ........................ | H03L 1/023 331/117 R |
| 8,466,750 B2* | 6/2013 | Chiu | .................... | H03B 5/1228 331/117 FE |
| 8,531,245 B2* | 9/2013 | Joubert | ..................... | H03L 1/00 331/10 |
| 8,674,772 B2* | 3/2014 | Shen | ........................ | H03L 1/02 331/117 R |

(Continued)

*Primary Examiner* — Patrick O'Neill
(74) *Attorney, Agent, or Firm* — Andrew Viger; Charles A. Brill; Frank D. Cimino

(57) ABSTRACT

A PLL including a VCO with a variable capacitance (such as an LC VCO) including a switched capacitor bank and a varactor, the PLL providing lock range extension over temperature using dynamic capacitor bank switching to dynamically adjust varactor set point based on junction temperature. The varactor is responsive to the Vctrl control voltage to adjust a capacitance of the variable capacitance to control the phase of the PLL signal. Compensation circuitry dynamically adjusts varactor set point by dynamically switching the capacitor bank based in a junction temperature associated with the PLL circuitry, thereby extending PLL lock range over temperature.

20 Claims, 6 Drawing Sheets

(56) References Cited

U.S. PATENT DOCUMENTS

| | | | |
|---|---|---|---|
| 9,520,884 B2* | 12/2016 | Frank | H03L 7/099 |
| 9,608,647 B1* | 3/2017 | Djahanshahi | H03B 1/00 |
| 2014/0354365 A1* | 12/2014 | Gao | H03L 1/023 |
| | | | 331/70 |

* cited by examiner

US 10,187,071 B2

PLL LOCK RANGE EXTENSION OVER TEMPERATURE

CROSS-REFERENCE TO RELATED APPLICATIONS

Priority is claimed under 37 CFR 1.78 and 35 USC 119(e) to U.S. Provisional Application 62/270,505, filed 21 Dec. 2015), which is incorporated by reference. << PLL lock range extension over temperate using capacitor bank switching during PLL operation

BACKGROUND

Technical Field

This Patent Disclosure relates generally to phase-locked loop systems.

Related Art

A phase-locked loop (PLL) circuit establishes a frequency/phase control loop around a VCO (voltage, or current, controlled oscillator), providing a Vctrl control voltage to adjust VCO frequency/phase to lock the VCO output to the frequency/phase of an input signal, such as a reference frequency signal.

CMOS-based VCO designs commonly use LC and Ring based VCOs. LC VCOs rely on a varactor to fine tune the Vctrl voltage, and commonly include a switching capacitor array/bank to extend the tuning range (extend Kvco gain).

The frequency range within which a PLL circuit can provide a locked output varies with the operation temperature of the PLL circuit, so that a PLL circuit may be unable to remain locked when the operation temperature fluctuates outside a specified temperature range (junction temperature). Two approaches to increasing lock range are increasing varactor size, and increasing the dynamic range of the Vctrl voltage. Increasing varactor size increases Kvco, which leads to an increase in phase noise. Increasing Vctrl can be restricted by varactor stress (reliability) considerations.

While this Background information references in particular an LC VCO, the Disclosure is more generally directed to VCOs with switched capacitor tuning.

BRIEF SUMMARY

This Brief Summary is provided as a general introduction to the Disclosure provided by the Detailed Description and Drawings, summarizing aspects and features of the Disclosure. It is not a complete overview of the Disclosure, and should not be interpreted as identifying key elements or features of, or otherwise characterizing or delimiting the scope of, the disclosed invention.

The Disclosure describes a methodology for PLL lock range extension over temperate using dynamic capacitor bank switching to dynamically adjust varactor set point during PLL operation.

According to aspects of the Disclosure, the PLL includes a VCO with a variable capacitance (such as an LC VCO) including a switched capacitor bank and a varactor. The PLL provides lock range extension over temperature using dynamic capacitor bank switching to dynamically adjust varactor set point based on junction temperature. The varactor is responsive to the Vctrl control voltage to adjust a capacitance of the variable capacitance to control the phase of the PLL signal. Compensation circuitry dynamically adjusts varactor set point by dynamically switching the capacitor bank based in a junction temperature associated with the PLL circuitry, thereby extending PLL lock range over temperature.

Other aspects and features of the invention claimed in this Patent Document will be apparent to those skilled in the art from the following Disclosure.

DETAILED DESCRIPTION

This Description and the Drawings constitute a Disclosure for PLL lock range extension over temperate using dynamic capacitor bank switching, such as to dynamically adjust varactor set point during PLL operation, including describing example embodiments, and illustrating various technical features and advantages.

The PLL lock range extension scheme can be used to extend the PLL lock range beyond that available based on varactor Kvco and dynamic range of Vctrl. Prior to running out of varactor voltage range, during PLL operation, a discrete (such as UFC) capacitor code change dynamically resets varactor set point voltage, extending the varactor tuning range in the direction of the varactor set point change.

In brief overview a PLL including a VCO with a variable capacitance (such as an LC VCO) including a switched capacitor bank and a varactor, the PLL providing lock range extension over temperature using dynamic capacitor bank switching to dynamically adjust varactor set point based on junction temperature. The varactor is responsive to the Vctrl control voltage to adjust a capacitance of the variable capacitance to control the phase of the PLL signal. Compensation circuitry dynamically adjusts varactor set point by dynamically switching the capacitor bank based in a junction temperature associated with the PLL circuitry, thereby extending PLL lock range over temperature.

Figure 1A:
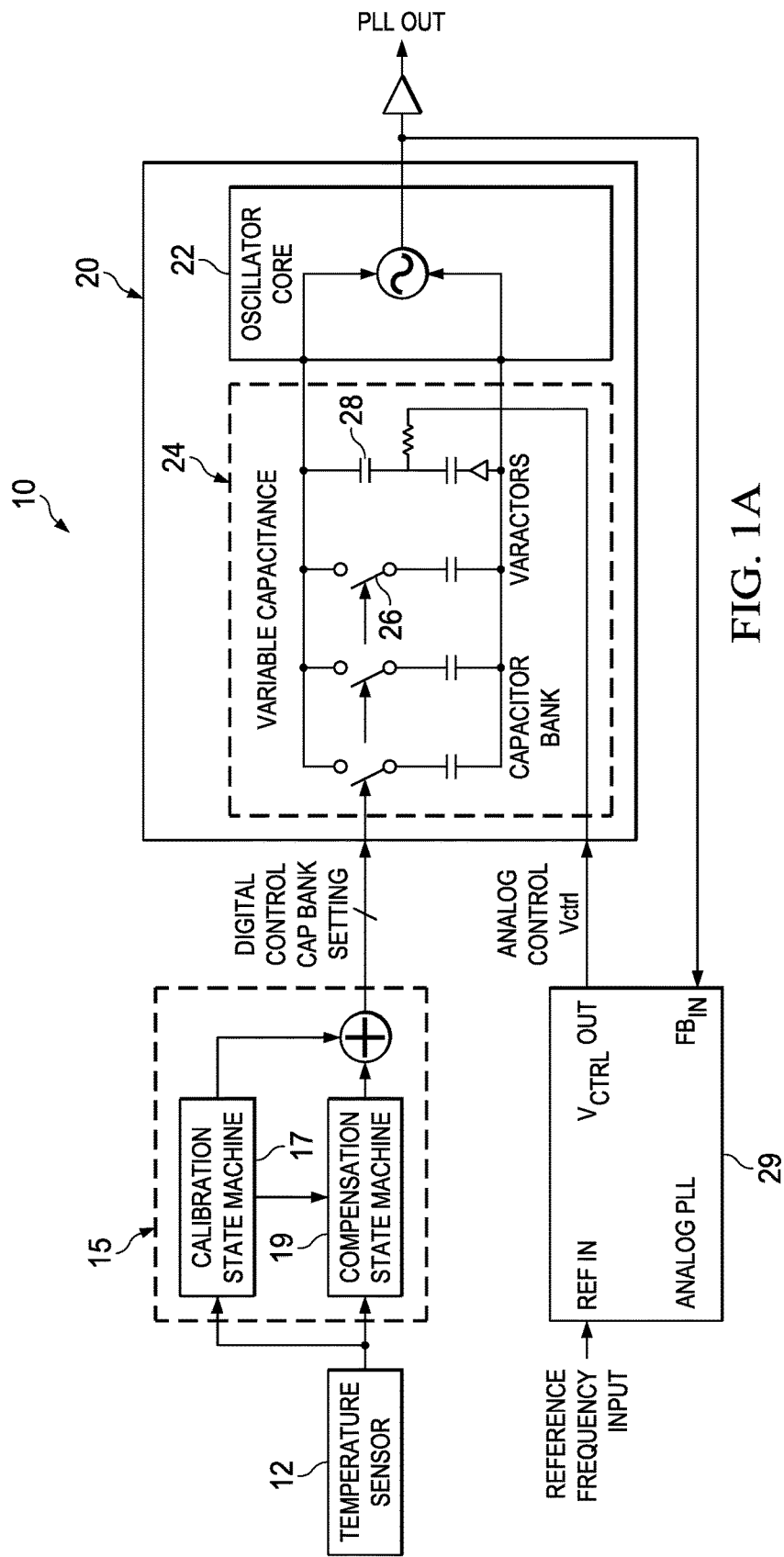
FIG. 1A illustrates an example embodiment of a PLL adapted for PLL lock range extension over temperate for a PLL with an LC VCO including a variable capacitance with a switched capacitor bank and a varactor, using dynamic capacitor bank switching to adjust varactor set point during PLL operation, when junction temperature exceeds predefined temperature thresholds, including adjustment during calibration to provide capacitor bank adjustment range (capacitor code bits/steps) for varactor set point adjustment during compensation/operation.

FIG. 1A illustrates an example embodiment of a PLL adapted for PLL lock range extension over temperate for a PLL with an LC VCO including a variable capacitance with a switched capacitor bank and a varactor, using capacitor bank switching to adjust varactor set point during PLL operation, when junction temperature exceeds pre-defined temperature thresholds, including adjustment during calibration to provide cap bank adjustment range (capacitor code bits/steps) for varactor set point adjustment during compensation/operation.

An analog PLL receives a reference frequency input, and provides a Vctrl control voltage to a VCO, based on a feedback voltage FBK. The example VCO is an LC VCO including a variable capacitance and a inductor coil.

The variable capacitance includes a varactor and a switched capacitor bank. The switched capacitor bank is used to provide a set point for the varactor. The varactor is controlled by the Vctrl control voltage.

Control for the capacitor bank includes a calibration state machine, and according to this Disclosure a compensation state machine. Both receive as inputs junction temperature information based on monitoring on-chip junction temperature.

The calibration state machine controls capacitor bank switching during a calibration routine, to configure the capacitor bank for a varactor set point. According to aspects of the Disclosure, the compensation state machine functions during PLL operation to adjust the varactor set point based on junction temperature (Tj) information. Specifically, when junction temperature exceeds pre-defined Tj thresholds, the compensation state machine introduces a digital (capacitor code) adjustment to the capacitor bank to adjust varactor set point in the direction of the capacitor code adjustment to the capacitor bank.

Figure 1B:
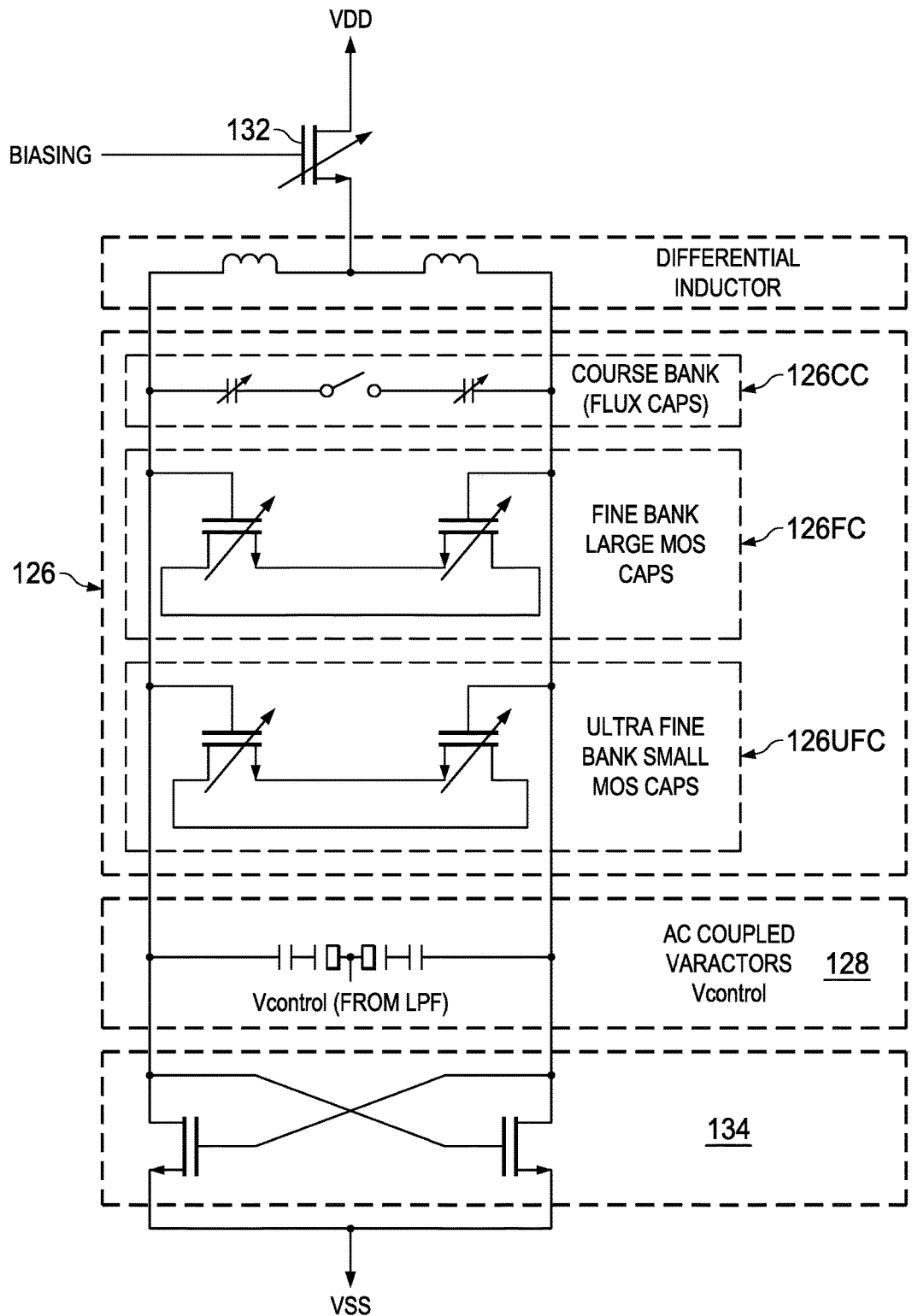
FIG. 1B illustrates an example variable capacitance circuit including a switched capacitor bank/array, and a varactor, the switched capacitor bank configured as a three-level capacitor bank, with UFC (ultra-fine capacitor code), FC (Fine capacitor code) and CC (Course capacitor code) banks or elements.

FIG. 1B illustrates an example variable capacitance circuit including a varactor and a switched capacitor bank/array. The example switched capacitor bank is configured as a three-level capacitor bank, with UFC (ultra-fine capacitor code), FC (Fine capacitor code) and CC (Course capacitor code) banks or elements. That is, the cells in capacitor bank are UFC, FC and CC, where UFC is the smallest tunable (discrete) capacitor in the capacitor bank.

Figure 2:
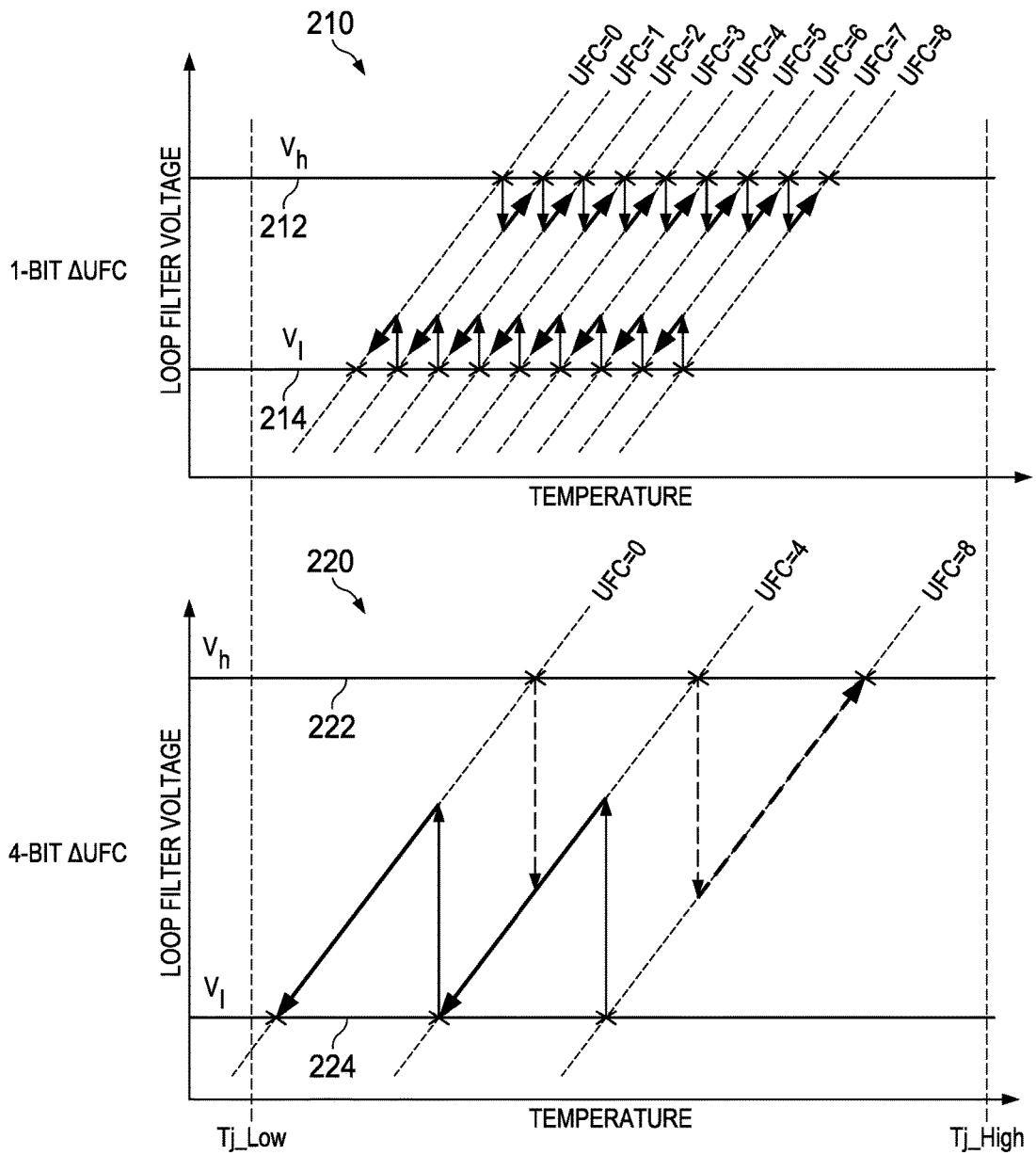
FIG. 2 provides example plots illustrating the PLL lock range extension scheme based on dynamic capacitor bank switching for varactor set point adjustment (dynamic adjustment of varactor range).
Figure 3:
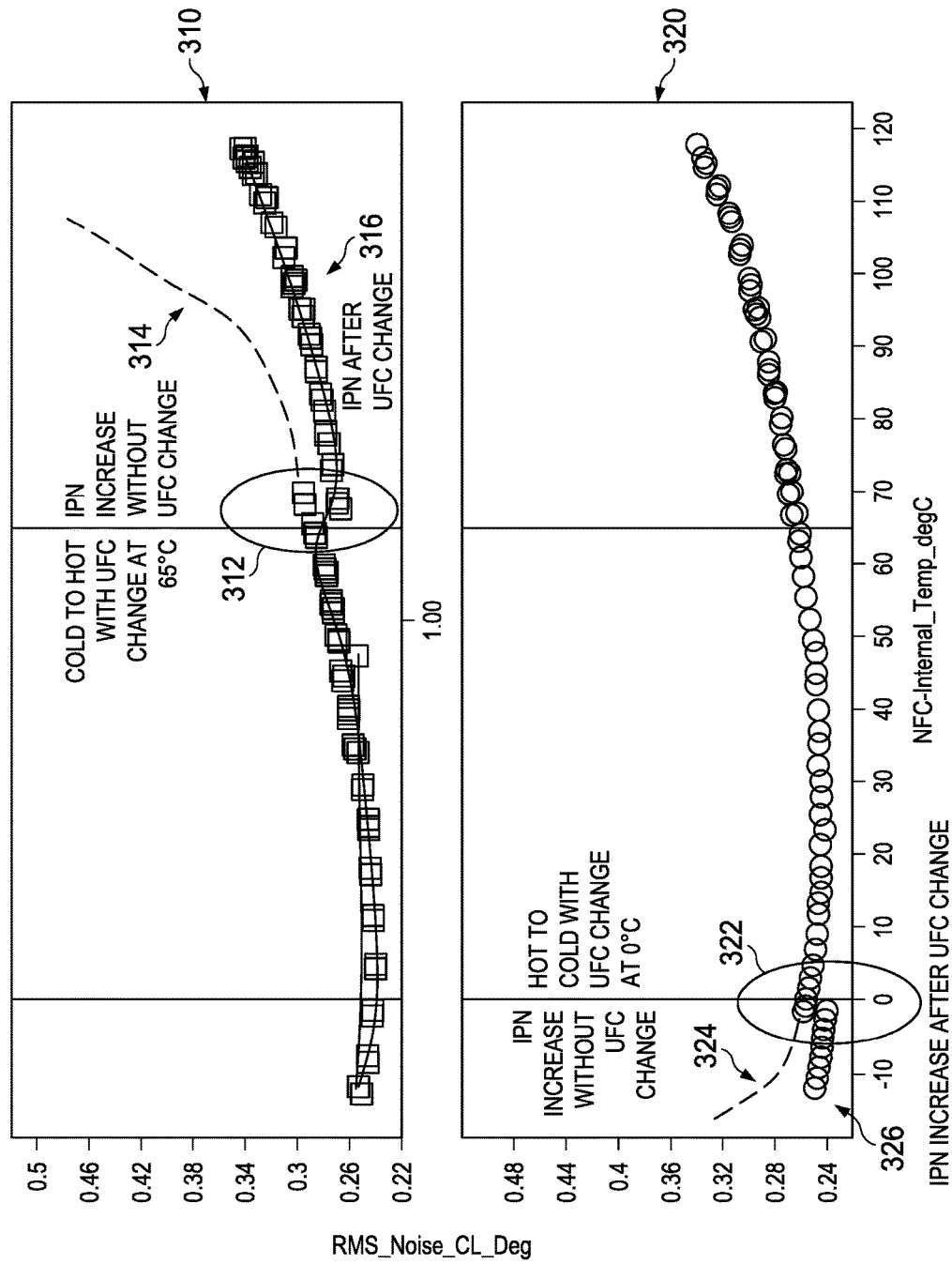
FIG. 3 provides an example plot illustrating the PLL lock range extension scheme, including dynamic varactor set point adjustment (with resulting transient), and including hysteresis.

Referring also to FIGS. 2 and 3, according to aspects of the Disclosure, during PLL operation, varactor set point can be adjusted by the compensation state machine in response to changes in junction temperature by providing digitally controlled capacitor codes to control capacitor bank switching. FIG. 2 illustrates, as a design example, both a 1-bit UFC change, and 4-bit UFC change.

For this design example, the capacitor codes ΔUFC (or, ΔUFC and ΔFC) are used to for varactor set point adjustment, where capacitance step size (capacitor code adjustment) is a design choice, as described further below. Adjustment of varactor set point during PLL operation ensures that over temperature the varactor loop filter control voltage Vctrl is retained in its dynamic range, extending varactor tuning range in the direction of the varactor set point adjustment.

According to other aspects of the Disclosure, during varactor set point calibration, the varactor set point can be adjusted by the calibration state machine to ensure sufficient varactor set point adjustment range (for example, ΔUFC or ΔUFC/ΔFC capacitor code bits) is available to the compensation state machine to provide varactor set point adjustment during PLL operation. That is, the calibration state machine can be configured such to ensure that, after calibration, the calibrated (initial) varactor set point (based on a digitally controlled capacitor code value of UFC/FC/CC input to the switched UFC/FC/CC capacitor bank) provides sufficient step size range (ΔFC and ΔUFC changes) in the each direction (increase or decrease).

Figure 4:
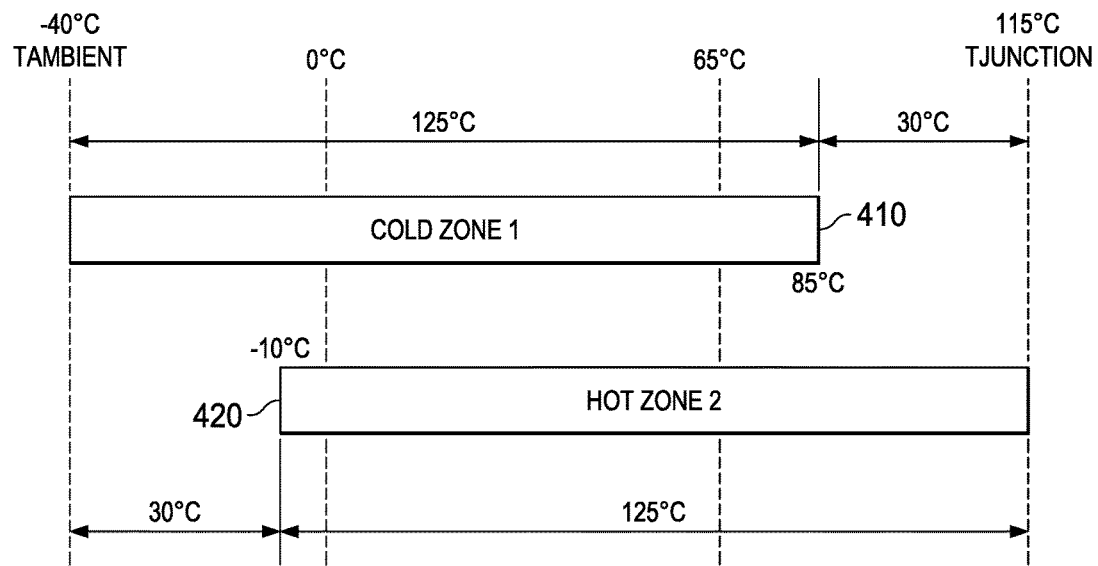
FIG. 4 illustrates a design example of the PLL lock range extension scheme, including introducing temperature zones into dynamic varactor set point.

Referring also to FIG. 4, as a design example, varactor set point calibration by the calibration state machine, based on junction temperature monitoring, can be configured to take into account: (a) Initial locking junction temperature Tj_lock, and (b) Temp Zone in which the PLL system is designed for operation (such as cold zone/hot zone), where the zone definition is (firmware) programmable, for example lock Tj_lock>0 Deg C. is hot-zone and Tj_lock<0 is cold-zone. If the calibration state machine returns a calibration capacitor code that does not provide sufficient varactor set point adjustment range, then calibration can be run again to provide a calibration capacitor code that ensures a pre-defined varactor set point tuning range for the compensation state machine during PLL operation. For example, calibration can be run with a pre-defined Coarse capacitor code CC, resulting in a new calibration capacitor code (CC, FC, UFC) to enable ΔFC and ΔUFC changes to the varactor set point by the compensation state machine.

That is, the LC VCO includes a variable capacitance with discrete capacitors that are digitally controlled (UFC, FC, CC). The varactor, controlled by Vctrl, is used to keep the PLL locked as temperature (or other factors) changes In order to keep the PLL locked as temperature drifts. During PLL operation, the compensation state machine enables a discrete UFC jump prior to running out of varactor voltage range, resetting the varactor set point voltage, and effectively allowing the varactor tuning range to be extended as the temperature increases/decreases.

Varactor set point compensation is implemented by: (a) monitoring on-chip junction temperature, and (b) changing the capacitor codes that control the switched capacitor banks (UFD/FC/CC) when the temperature reaches a pre-defined threshold, to permit the compensation state machine to adjust varactor set point during PLL operation.

During PLL operation, as described further below, the compensation state machine runs background temperature monitoring with hysteresis as follows: (a) for low to high, Zone 1 to Zone 2, UFC transition takes place at 65° C., and (b) for high to low, Zone 2 to Zone 1, UFC transition takes place at 0° C.

Referring to FIG. 4, as a design example, at the time of varactor set point calibration, if the locking temperature is less than or equal to 0° C., then Zone 1 is selected, otherwise Zone 2 is selected. Tambient at time of locking is between −40° C. and 85° C. (105° C. Tjunction).

As an alternative design example, varactor set point calibration by the calibration state machine can be configured for operation with an extra UFC bank UFC_Temp parked in the mid code during varactor set point calibration. The additional UFC bank ensures that there are UFC bits available to adjust varactor set point for frequency drift with temperature in both directions with the desired step size. As a design example: (a) UFC_Temp can be 16 capacitor code bits wide, and UFC_Core can be 8 capacitor code bits wide. During calibration, UFC_Temp is parked mid-code (8 bits on and 8 bits off), and UFC_Core is adjusted during calibration. For lock range extension, UFC_Temp is incremented/decremented in appropriate step-size at the desired temperature threshold, while UFC_Core is left un-changed at the calibration value. This design example obtains the desired calibration capacitor code in a single calibration run.

Figure 5:
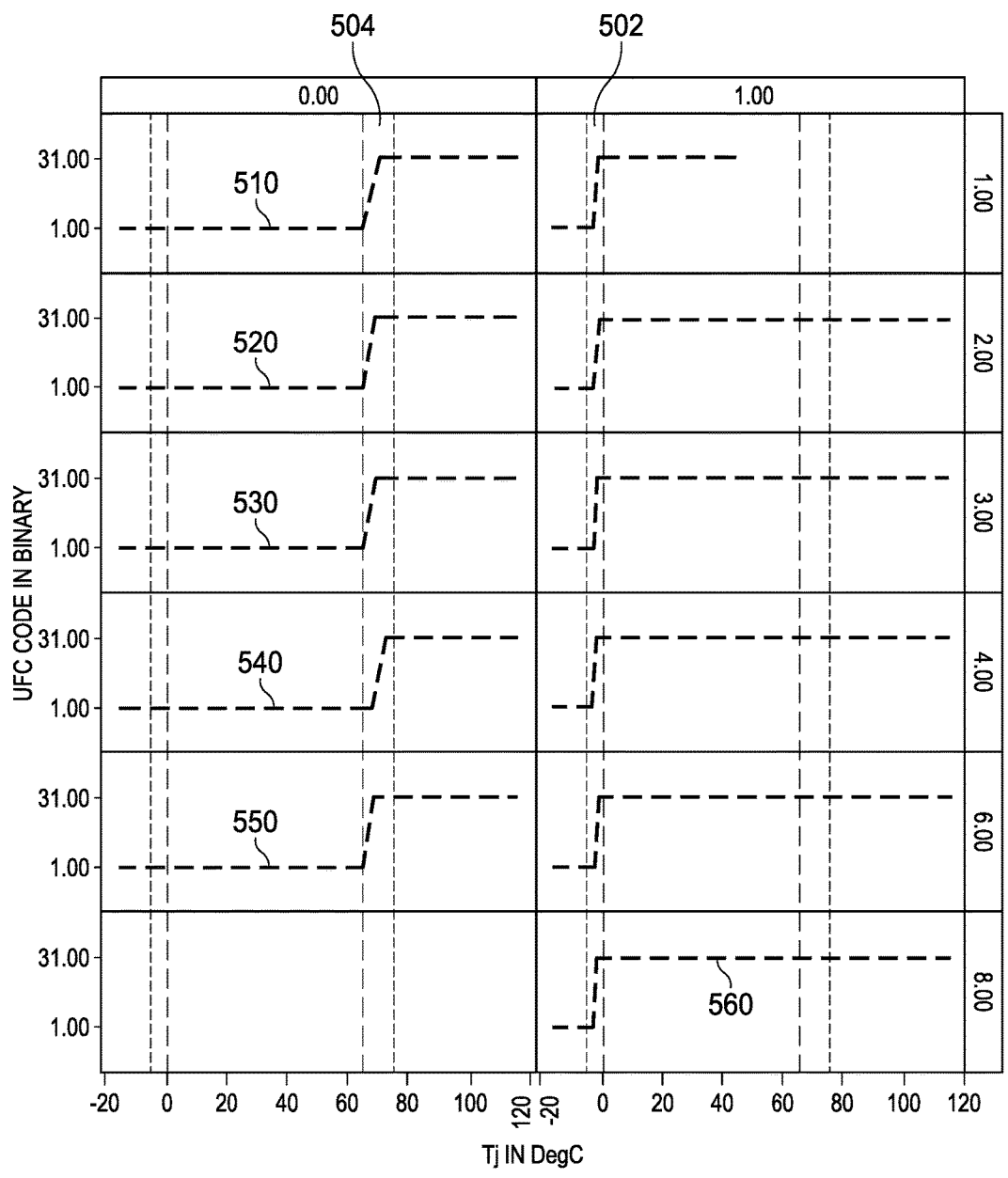
FIG. 5 illustrates a design example of the PLL lock range extension scheme, including introducing hysteresis into dynamic varactor set point adjustment.

FIG. 5 illustrates PLL lock range extension over temperate, including varactor set point adjustment, and including introducing hysteresis to reduce the number of varactor set point adjustments, and the associated transients, as illustrated in FIG. 3. Hysteresis points are programmable. As a design example, transition zones can be defined and implemented by the compensation state machine. Other transition zone factors can include limiting varactor set point adjustment to the transition slot between TX off and RX on.

As a design example, the lock range extension scheme with hysteresis in FIG. 5 illustrates an implementation with hysteresis transition points at 0 Deg and 60 Deg, i.e. the temperature thresholds where UFC bits are changed by the compensation state machine to adjust varactor set point during PLL operation. Specifically, going from cold-zone to hot-zone the UFC change takes place at 60 Deg C., while going from hot-zone to cold-zone UFC changes at 0 Deg C., providing hysteresis to the capacitor code change to reduce varactor set point adjustment transients.

Figure 6:
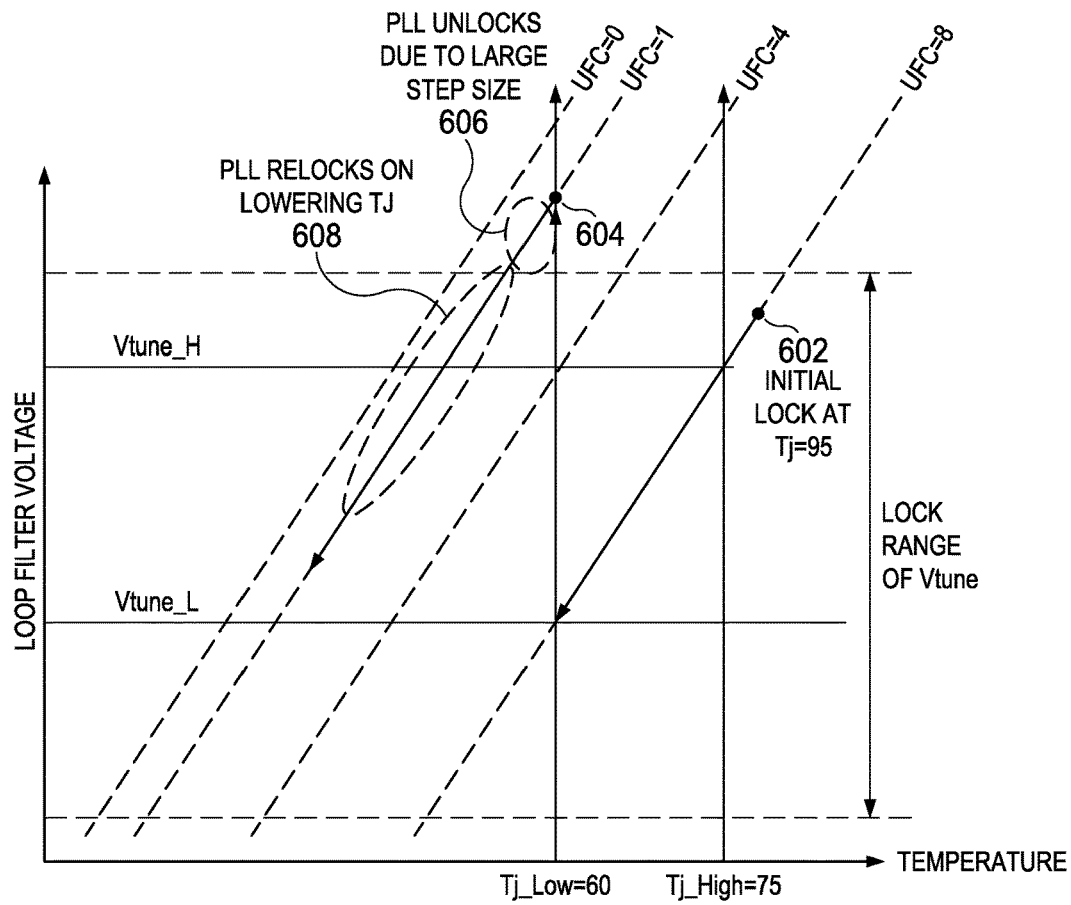
FIG. 6 illustrates, for the PLL lock range extension scheme, an effect of capacitor code step size on transient performance in dynamically adjusting varactor set point.

Referring to FIGS. 3 and 6, a discrete change in capacitance (as opposed to a continuous change in capacitance as occurs in the varactor) introduces transients (steady state phase change). Such transients can be counteracted by a number of design techniques. For example, avoiding changing capacitor codes, and therefore varactor set point, at any temperature (or equivalently based on any change in Vctrl), and instead, varactor set point adjustment is done at the Vctrl values where the loop gain is high, and the varactor still has some margin, and the PLL is not at the out of lock threshold. As another example, the smallest number of UFC bits can be used to extend the range only as needed in order to minimize transients.

According to aspects of the Disclosure, a PLL adapted for PLL lock range extension over temperate, such as a PLL with an LC VCO, including a variable capacitance with a switched capacitor bank and a varactor, and including using capacitor bank switching to adjust varactor set point during PLL operation, when junction temperature exceeds predefined temperature thresholds. Discrete capacitor steps to adjust varactor set point allows for the reuse of the varactor at a new varactor set point based on monitoring of on-chip junction temperature through on-chip temperature sensor to allow change in capacitor code (ΔUFC and ΔFC) at desired temperature threshold. The PLL lock extension scheme based on adjustments to varactor set does not monitor Vctrl voltage (avoiding the associated noise penalty). Temperature thresholds for varactor set point adjustment, including hysteresis, are programmable, thus allowing lock range extension to take into account geographical considerations. As an example, the compensation state machine can be designed for 5 Deg/10 Deg/30 Deg extension in lock range over temperature, with programmable step size. Programmable hysteresis allows for the extended lock range to remain valid (PLL locking not disturbed) for extended duration of time, without introducing excessive transients. The scheme avoids overhead for higher Kvco (larger varactor), and loop filter capacitor size. The voltage range needed on the Vctrl node is reduced, thus relaxing the stress tolerance of devices, and the need of special higher Voltage LDOs to support higher Vctrl voltage. The scheme provides a design trade-off between step size and settling transient, and uses hysteresis to reduce transients due to dynamic varactor set point adjustment.

The Disclosure provided by this Description and the Figures sets forth example embodiments and applications illustrating aspects and features of the invention, and does not limit the scope of the invention, which is defined by the claims. Known circuits, connections, functions and operations are not described in detail to avoid obscuring the principles and features of the invention. These example embodiments and applications, including example design considerations/choices/tradeoffs, can be used by ordinarily skilled artisans as a basis for modifications, substitutions and alternatives to construct other embodiments, including adaptations for other applications.

The invention claimed is:

1. A circuit including PLL (phase-locked loop) circuitry, the circuit comprising
   VCO (voltage controlled oscillator) circuitry, including a VCO oscillator and a variable capacitance, the VCO oscillator providing a PLL signal with a PLL phase controlled by the variable capacitance;
   the variable capacitance including:
      a varactor responsive to an oscillator control signal to adjust a varactor capacitance within a defined tuning range relative to an adjustable varactor set point, to control the PLL phase of the PLL signal, and
      a switched capacitor bank to provide a discrete capacitance to adjust the varactor set point, the switched capacitor bank, including at least
         a first capacitor bank responsive to a first discrete capacitor control signal to select a corresponding first discrete capacitance adjustment based on first discrete capacitance steps, and
         a second capacitor bank responsive to a second discrete capacitor control signal to select a corresponding second discrete capacitance adjustment based on second discrete capacitance steps,
         the first discrete capacitance steps greater than the second discrete capacitance steps; and
   compensation circuitry to generate, based at least in part on a junction temperature associated with the PLL circuitry, the first and second discrete capacitor control signals, to dynamically adjust the varactor set point by dynamically switching at least one of the first and second capacitor banks by a corresponding discrete capacitance adjustment.

2. The circuit of claim 1, wherein the VCO is an LC VCO, including at least one inductor (L) coupled in parallel with the switched capacitor bank, including in parallel with at least the first and the second capacitor banks.

3. The circuit of claim 1, wherein the switched capacitor bank includes a third capacitor bank,
   the first capacitor bank providing the first discrete capacitance adjustment as a coarse adjustment based on the first discrete capacitance steps;
   the second capacitor bank providing the second discrete capacitance adjustment as a fine adjustment based on the second discrete capacitance steps;
   the third capacitor bank responsive to a third discrete capacitor control signal to select a corresponding third discrete capacitance adjustment as an ultrafine adjustment based on third discrete capacitance steps that are less than the second discrete capacitance steps.

4. The circuit of claim 3, wherein the first capacitor bank comprises flux capacitors, the second capacitor bank comprises second MOS capacitors, and the third capacitor bank comprises third MOS capacitors, the second MOS capacitors larger than the third MOS capacitors.

5. The circuit of claim 3:
   further comprising calibration circuitry to generate, based at least in part on the junction temperature associated with the PLL circuitry, a discrete capacitor calibration signal including the first discrete capacitor control signal, to adjust the varactor set point by switching the first capacitor bank to provide the corresponding first discrete capacitance adjustment as a coarse adjustment; and the compensation circuitry operable to generate, based at least in part on the junction temperature associated with the PLL circuitry, the second and third discrete capacitor control signals, to dynamically adjust the varactor set point by dynamically switching at least one of the second and third capacitor banks as a respective fine and ultra-fine adjustment.

6. The circuit of claim 1, wherein a discrete capacitance adjustment to the varactor set point is provided when the oscillator control signal approaches an end of the tuning range, such that the varactor set point and the associated tuning range are adjusted based on increases or decreases in junction temperature.

7. The circuit of claim 1, further comprising:
calibration circuitry to generate, based on the junction temperature associated with the PLL circuitry, a discrete capacitor calibration signal, including at least the first discrete capacitor control signal, to adjust the varactor set point by switching at least the first capacitor bank by the corresponding first discrete capacitance adjustment.

8. The circuit of claim 7, wherein the calibration circuitry generates the discrete capacitor calibration signal based on a temperature zone in which the circuit is operable, and the junction temperature associated with the PLL circuitry.

9. The circuit of claim 1, wherein
the compensation circuitry to generate the first and second discrete capacitor control signal to adjust varactor set point using hysteresis.

10. A PLL (phase-locked loop) circuit, comprising
a reference oscillator circuit to generate a reference signal;
PLL circuitry coupled to the reference oscillator, and including:
VCO (voltage controlled oscillator) circuitry coupled to receive the reference signal, and responsive to an oscillator control signal to output a PLL signal with a phase locked to a phase of the reference signal;
the VCO circuitry including a VCO oscillator, and a variable capacitance, the VCO oscillator providing the PLL signal with a PLL phase controlled by the variable capacitance, the variable capacitance including:
a varactor responsive to the oscillator control signal to adjust a varactor capacitance within a defined tuning range relative to an adjustable varactor set point, to control the PLL phase of the PLL signal, and
a switched capacitor bank to provide a discrete capacitance to adjust the varactor set point, the switched capacitor bank, including at least:
a first capacitor bank responsive to a first discrete capacitor control signal to select a corresponding first discrete capacitance adjustment based on first discrete capacitance steps, and
a second capacitor bank responsive to a second discrete capacitor control signal to select a corresponding second discrete capacitance adjustment based on second discrete capacitance steps, the first discrete capacitance steps greater than the second discrete capacitance steps; and
compensation circuitry to generate, based at least in part on a junction temperature associated with the PLL circuitry, the first and second discrete capacitor control signals, to dynamically adjust the varactor set point by dynamically switching at least one of the first and second capacitor banks by a corresponding discrete capacitance adjustment.

11. The circuit of claim 10, wherein the VCO is an LC VCO, including at least one inductor (L) coupled in parallel with the switched capacitor bank, including in parallel with at least the first and the second capacitor banks.

12. The circuit of claim 10, wherein the switched capacitor bank includes a third capacitor bank,
the first capacitor bank providing the first discrete capacitance adjustment as a coarse adjustment based on the first discrete capacitance steps;
the second capacitor bank providing the second discrete capacitance adjustment as a fine adjustment based on the second discrete capacitance steps;
the third capacitor bank responsive to a third discrete capacitor control signal to select a corresponding third discrete capacitance adjustment as an ultrafine adjustment based on third discrete capacitance steps that are less than the second discrete capacitance steps.

13. The circuit of claim 12, wherein the first capacitor bank comprises flux capacitors, the second capacitor bank comprises second MOS capacitors, and the third capacitor bank comprises third MOS capacitors, the second MOS capacitors larger than the third MOS capacitors.

14. The circuit of claim 12, wherein a discrete capacitance adjustment to the varactor set point is provided when the oscillator control signal approaches an end of the tuning range, such that the varactor set point and the associated tuning range are adjusted based on increases or decreases in junction temperature.

15. The circuit of claim 12:
further comprising calibration circuitry to generate, based at least in part on the junction temperature associated with the PLL circuitry, a discrete capacitor calibration signal including the first discrete capacitor control signal, to adjust the varactor set point by switching the first capacitor bank to provide the corresponding first discrete capacitance adjustment as a coarse adjustment;
the compensation circuitry operable to generate, based at least in part on the junction temperature associated with the PLL circuitry, the second and third discrete capacitor control signals, to dynamically adjust the varactor set point by dynamically switching at least one of the second and third capacitor banks as a respective fine and ultra-fine adjustment.

16. The circuit of claim 10, further comprising:
calibration circuitry to generate, based on the junction temperature associated with the PLL circuitry, a discrete capacitor calibration signal, including at least the first discrete capacitor control signal, to adjust the varactor set point by switching at least the first capacitor bank by the corresponding first discrete capacitance adjustment.

17. The circuit of claim 16, wherein the calibration circuitry generates the discrete capacitor calibration signal based on a temperature zone in which the circuit is operable, and the junction temperature associated with the PLL circuitry.

18. The circuit of claim 10, wherein:

the compensation circuitry to generate the first and second discrete capacitor control signals to adjust varactor set point using hysteresis.

19. The circuit of claim 10, wherein:

the PLL circuitry comprises an integrated circuit including a reference signal input terminal; and the reference oscillator circuit coupled to the reference signal input terminal to provide the reference signal.

20. A method of controlling a PLL (phase-locked loop) that includes a VCO (voltage controlled oscillator) with a VCO oscillator tuned with a variable capacitance circuit to generate a PLL signal with a phase locked to a phase of a reference signal, the variable capacitance circuit including a varactor responsive to an oscillator control signal to adjust a varactor capacitance within a defined tuning range relative to an adjustable varactor set point to control the PLL phase of the PLL signal, the method comprising configuring the variable capacitance to include:
  a switched capacitor bank to provide a discrete capacitance to adjust the varactor set point,
  the switched capacitor bank, including at least first and second capacitor banks;

generating a first discrete capacitor control signal to select a corresponding first discrete capacitance adjustment based on first discrete capacitance steps; and generating a second discrete capacitor control signal to select a corresponding second discrete capacitance adjustment based on second discrete capacitance steps;

the first discrete capacitance steps greater than the second discrete capacitance steps; and the first and second discrete capacitor control signals generated based at least in part on a junction temperature associated with the PLL, to dynamically adjust the varactor set point by dynamically switching at least one of the first and second capacitor banks by a corresponding discrete capacitance adjustment.

* * * * *